(12) United States Patent
Huang et al.

(10) Patent No.: US 9,366,421 B2
(45) Date of Patent: Jun. 14, 2016

(54) LED BASE MODULE AND LED LIGHTING DEVICE

(71) Applicants: BRIGHTEK OPTOELECTRONIC (SHENZHEN) CO., LTD., Shenzhen (CN); BRIGHTEK OPTOELECTRONIC CO., LTD., Taoyuan County (TW)

(72) Inventors: Chien-Chung Huang, Taoyuan County (TW); Chih-Ming Wu, Taoyuan County (TW); Yi Hsun Chen, Taipei (TW)

(73) Assignees: BRIGHTEK OPTOELECTRONIC (SHENZHEN) CO., LTD., Shenzhen (CN); BRIGHTEK OPTOELECTRONIC CO., LTD., Taoyuan County (TW)

( * ) Notice: Subject to any disclaimer, the term of this patent is extended or adjusted under 35 U.S.C. 154(b) by 78 days.

(21) Appl. No.: 14/540,217

(22) Filed: Nov. 13, 2014

(65) Prior Publication Data

US 2015/0146425 A1     May 28, 2015

(30) Foreign Application Priority Data

Nov. 22, 2013   (TW) .............................. 102142652 A

(51) Int. Cl.
*F21V 23/00* (2015.01)
*F21K 99/00* (2016.01)
(Continued)

(52) U.S. Cl.
CPC ................. *F21V 23/005* (2013.01); *F21K 9/00* (2013.01); *F21K 9/30* (2013.01); *F21V 15/00* (2013.01); *H01L 25/167* (2013.01); *H05K 1/0201* (2013.01); *F21V 25/00* (2013.01);
(Continued)

(58) Field of Classification Search
CPC ............ F21K 9/00; F21K 9/30; F21V 15/00; F21V 23/005; F21V 25/00; F21V 29/507; F21Y 2101/02; F21Y 2105/001; F21Y 2113/005; H05K 1/181; H05K 1/0201; H05K 1/0216; H05K 2201/10106; H01L 25/167; H01L 25/0753; H01L 2924/0002
See application file for complete search history.

(56) References Cited

U.S. PATENT DOCUMENTS

2009/0166657 A1   7/2009   Yamada et al.
2011/0299268 A1   12/2011  Ishizaki et al.
(Continued)

FOREIGN PATENT DOCUMENTS

| | | | |
|---|---|---|---|
| EP | 2224485 A2 | 9/2010 | |
| EP | 2444715 A2 | 4/2012 | |

(Continued)

*Primary Examiner* — Stephen F Husar
(74) *Attorney, Agent, or Firm* — Li & Cai Intellectual Property (USA) Office

(57) ABSTRACT

An LED base module includes a substrate and several driving units disposed on the substrate. Each driving unit includes a circuit layer, a separating wall, an LED driving component, a packaging member, and two electrodes. The circuit layer, the separating wall, and the electrodes are disposed on the substrate. A portion of the substrate corresponding to each driving unit is provided with an LED area and an electronic component area defined by the separating wall. The LED driving component is disposed on a portion of the circuit layer arranged in the electronic component area. The packaging member is formed on the electronic component area to entirely cover the LED driving component. A portion of the circuit layer arranged in the LED bonding area is used to bond to an LED chip, and the separating wall is configured to separate the LED chip and the LED driving component.

10 Claims, 10 Drawing Sheets

(51) Int. Cl.
H01L 25/16 (2006.01)
F21V 15/00 (2015.01)
H05K 1/02 (2006.01)
*F21V 25/00* (2006.01)
*H01L 25/075* (2006.01)
*F21Y 101/02* (2006.01)
*F21Y 105/00* (2016.01)
*F21Y 113/00* (2016.01)
*F21V 29/507* (2015.01)
*H05K 1/18* (2006.01)

(52) U.S. Cl.
CPC ........... *F21V 29/507* (2015.01); *F21Y 2101/02* (2013.01); *F21Y 2105/001* (2013.01); *F21Y 2113/005* (2013.01); *H01L 25/0753* (2013.01); *H01L 2924/0002* (2013.01); *H05K 1/0216* (2013.01); *H05K 1/181* (2013.01); *H05K 2201/10106* (2013.01)

(56) References Cited

U.S. PATENT DOCUMENTS

| | | |
|---|---|---|
| 2013/0088867 A1 | 4/2013 | Chung et al. |
| 2013/0301261 A1 | 11/2013 | Chou et al. |
| 2015/0016121 A1* | 1/2015 | Kokubo ................. F21S 8/043 362/365 |

FOREIGN PATENT DOCUMENTS

| | | |
|---|---|---|
| EP | 2500636 A1 | 9/2012 |
| JP | 2006332618 A | 12/2006 |
| TW | 201124671 A1 | 7/2011 |
| TW | 201211442 A1 | 3/2012 |
| TW | 200832657 A1 | 6/2012 |
| TW | M433050 U1 | 7/2012 |

* cited by examiner

LED BASE MODULE AND LED LIGHTING DEVICE

BACKGROUND OF THE INVENTION

1. Field of the Invention

The instant invention relates to a base module and a lighting device; in particular, to an LED base module and an LED lighting device each having a separating wall for reducing interference between components.

2. Description of Related Art

In recent years, the application of light-emitting diode (LED) chip has been increasingly widespread, and the LED chip has been developed to have high-power and high illumination intensity, such that an LED lighting device having the LED chips is sufficient to replace traditional lighting.

However, due to the structural design of the conventional LED lighting device, the LED lighting device manufacturer needs a series of processes to produce the LED lighting device after obtaining the LED chip. The LED lighting device achieves lighting function by connecting to an external power supply (e.g., conventional socket).

The processes of producing the LED lighting device not only have technical barriers, but also have funding and processing equipment problems, thus a certain threshold is generated to the LED lighting device manufacturer. Thus, the above problems reduce the promotion of LED lighting device, and the above problems also slow down the speed of replacing the traditional lighting with the LED lighting device.

To achieve the abovementioned improvement, the inventors strive via industrial experience and academic research to present the instant disclosure, which can provide additional improvement as mentioned above.

SUMMARY OF THE INVENTION

The instant invention provides an LED base module which can be used for lighting after bonding to an LED chip and an LED lighting device produced based on the LED base module.

The embodiment of the instant invention provides an LED base module, comprising: a substrate integrally formed as one body and defining a plurality of carrying portions thereon, wherein each carrying portion has a first surface and an opposite second surface; and a plurality of driving units respectively disposed on the carrying portions of the substrate, wherein each driving unit comprises: a circuit layer disposed on the carrying portion; a separating wall disposed on the first surface of the carrying portion, wherein the first surface has an LED area and at least one electronic component area, and the LED area and the electronic component area are defined by the separating wall; an LED driving component disposed on the electronic component area, wherein the LED driving component is electrically connected to a portion of the circuit layer arranged in the electronic component area; a packaging element formed on the electronic component area, wherein the LED driving component is embedded in the packaging element; and two electrodes disposed on the carrying portion and arranged outside the LED area and the electronic component area, wherein the electrodes are electrically connected to the circuit layer, wherein a portion of the circuit layer arranged in the LED area is provided for bonding to an LED chip, thereby establishing electrical connection between the LED driving component and the LED chip, and wherein the separating wall is provided for separating the LED driving component from the LED chip, thereby reducing thermal and electromagnetic interferences between the LED driving component and the LED chip.

The embodiment of the instant invention also provides an LED lighting device, comprising: a carrying portion having a first surface and an opposite second surface; a circuit layer disposed on the carrying portion; a separating wall disposed on the first surface of the carrying portion, wherein the first surface has an LED area and at least one electronic component area, and the LED area and the electronic component area are defined by the separating wall; an LED chip mounted on the LED area and electrically connected to a portion of the circuit layer arranged in the LED area; a translucent gel formed on the LED area, wherein the LED chip is embedded in the translucent gel; an LED driving component disposed on the electronic component area, wherein the LED driving component is electrically connected to a portion of the circuit layer arranged in the electronic component area for electrically connecting to the LED chip by the circuit layer; a packaging element formed on the electronic component area, wherein the LED driving component is embedded in the packaging element; and two electrodes disposed on the carrying portion and arranged outside the LED area and the electronic component area, wherein the electrodes are electrically connected to the circuit layer, wherein the separating wall is provided for separating the LED driving component from the LED chip, thereby reducing thermal and electromagnetic interferences between the LED driving component and the LED chip.

In summary, the LED base module of the instant disclosure is provided with the LED driving component, such that the LED base module can be directly used for lighting after bonding to an LED chip, thereby reducing the threshold for the LED lighting device manufacturer.

Moreover, the LED base module and the LED lighting device each have the separating wall for reducing thermal and electromagnetic interferences between the LED driving component and the LED chip.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

DETAILED DESCRIPTION OF THE PREFERRED EMBODIMENTS

Figure 1:
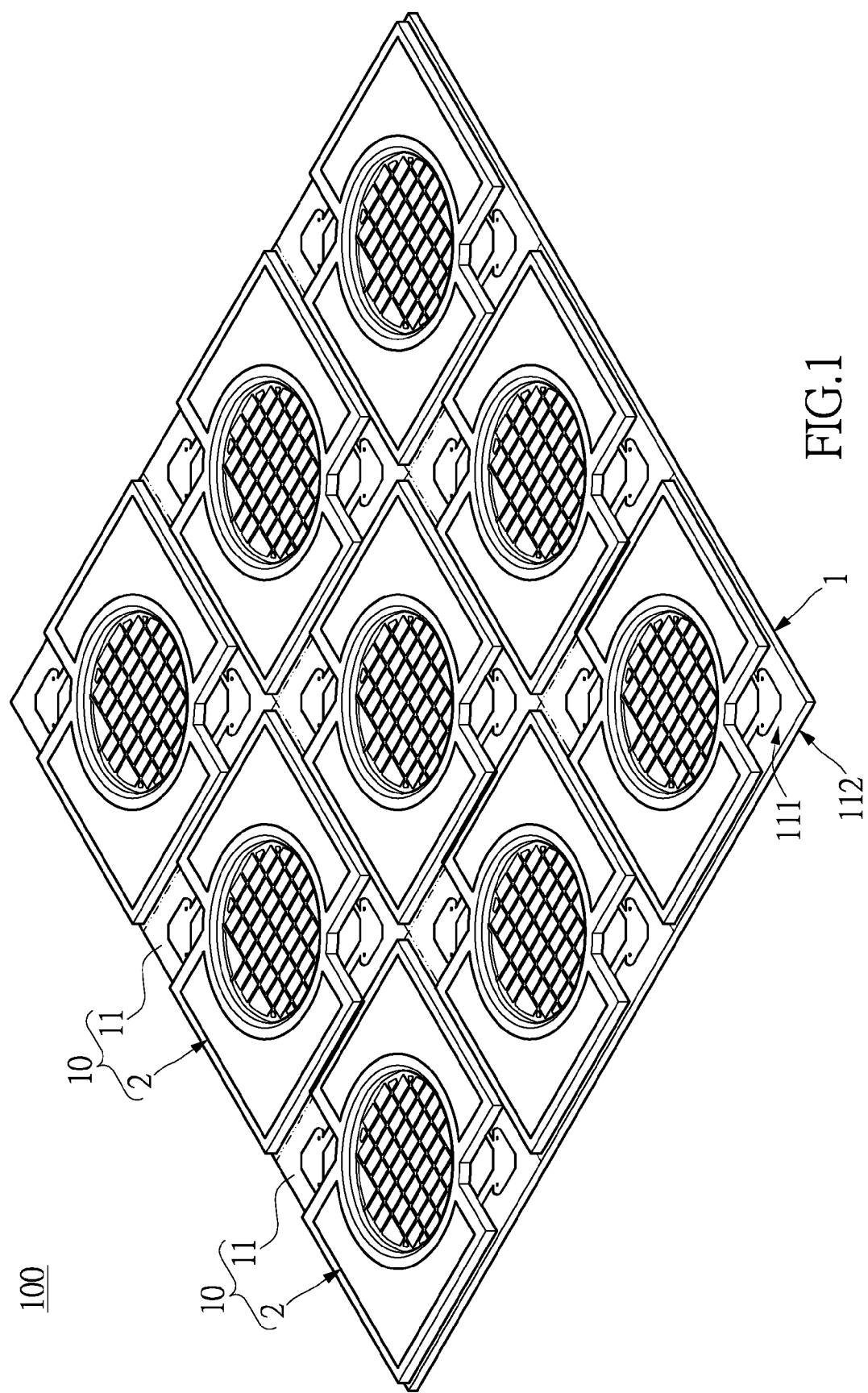
FIG. 1 is a perspective view showing an LED base module of the instant invention.
Figure 2:
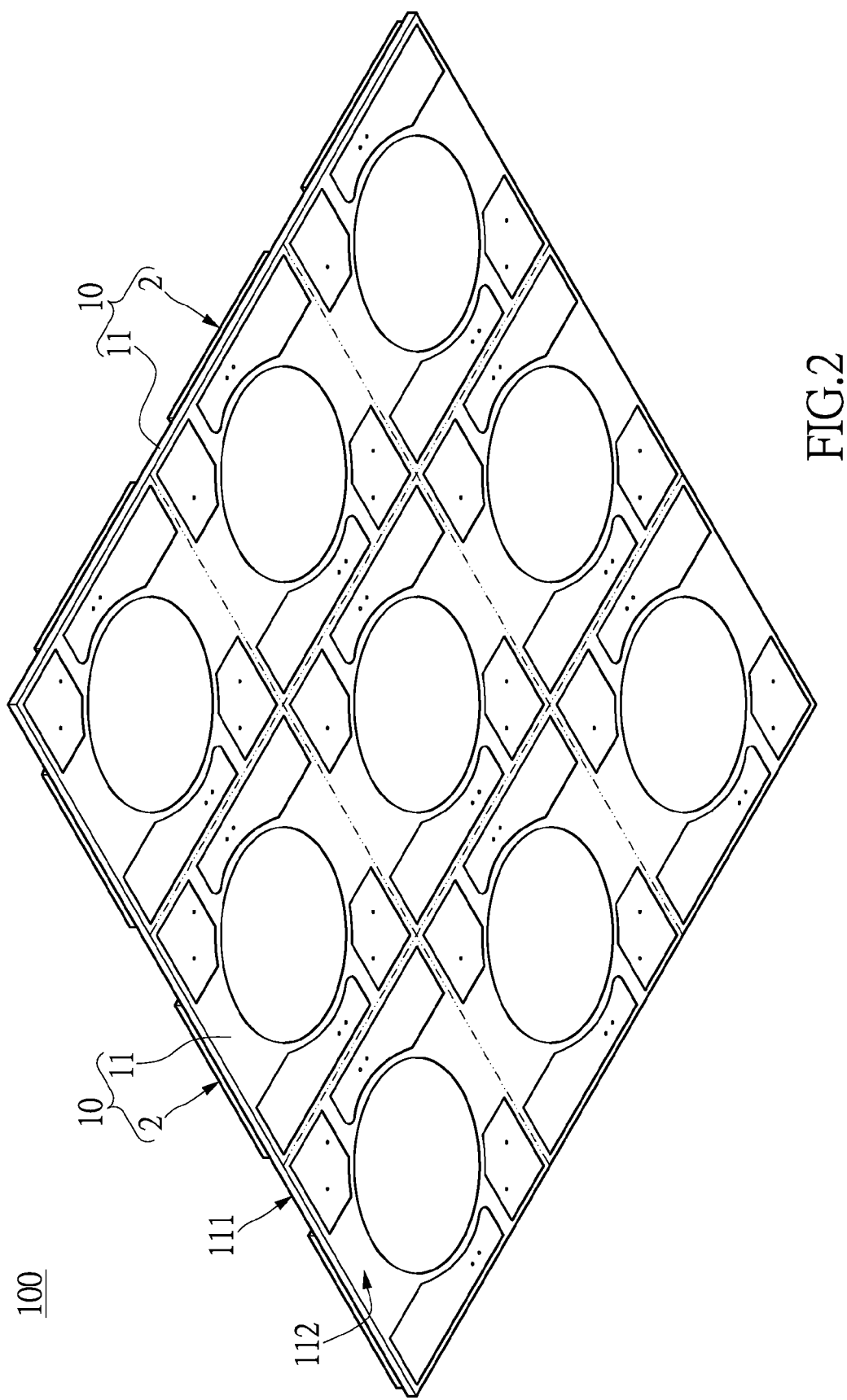
FIG. 2 is a perspective view showing the LED base module from another viewing angle.

Please refer to FIGS. 1 and 2, which show an embodiment of the instant invention. References are hereunder made to the detailed descriptions and appended drawings in connection with the instant invention. However, the appended drawings are merely shown for exemplary purposes, rather than being used to restrict the scope of the instant invention.

The instant embodiment provides an LED base module 100 including a substrate 1 and a plurality of driving units 2. The substrate 1 is preferably a ceramic substrate, but is not limited thereto. The substrate 1 is integrally formed as one body and defines a plurality of carrying portions 11 each having square or rectangular shape. Each carrying portion 11 has a first surface 111 and an opposite second surface 112 (e.g., the top surface and the bottom surface of the substrate 1 as shown in FIG. 1). The driving units 2 are respectively formed on the carrying portions 11 of the substrate 1.

Figure 6:
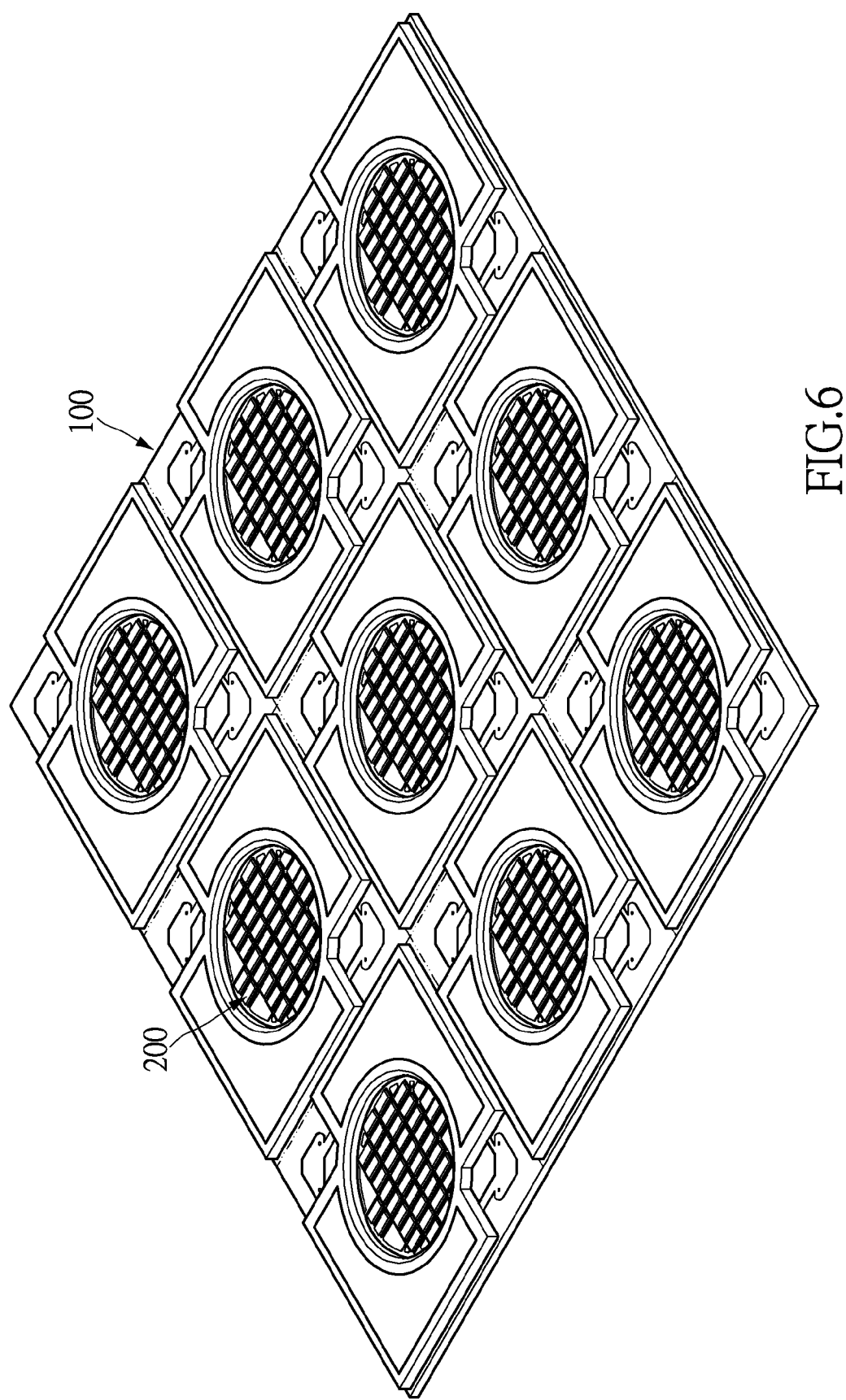
FIG. 6 is a perspective view showing the LED base module and the LED chips mounted on the LED base module.

Each carrying portion 11 of the substrate 1 and the corresponding driving unit 2 are defined as an LED base 10, and each LED base 10 of the LED base module 100 can be operated to light after bonding to an LED chip 200 (as shown in FIG. 6).

Incidentally, FIGS. 1 and 2 of the instant embodiment only show the substrate 1 having nine carrying portions 11 and nine driving units 2 formed on the substrate 1 for example, but the size of the substrate 1 and the number of the driving unit 2 are not limited thereto. Moreover, in order to clearly disclose the LED base module 100, the following description only discloses one carrying portion 11 and the corresponding driving unit 2, but that does not mean that the substrate 1 is a detachable construction. That is to say, the substrate 1 is still integrally formed in one piece.

Figure 3:
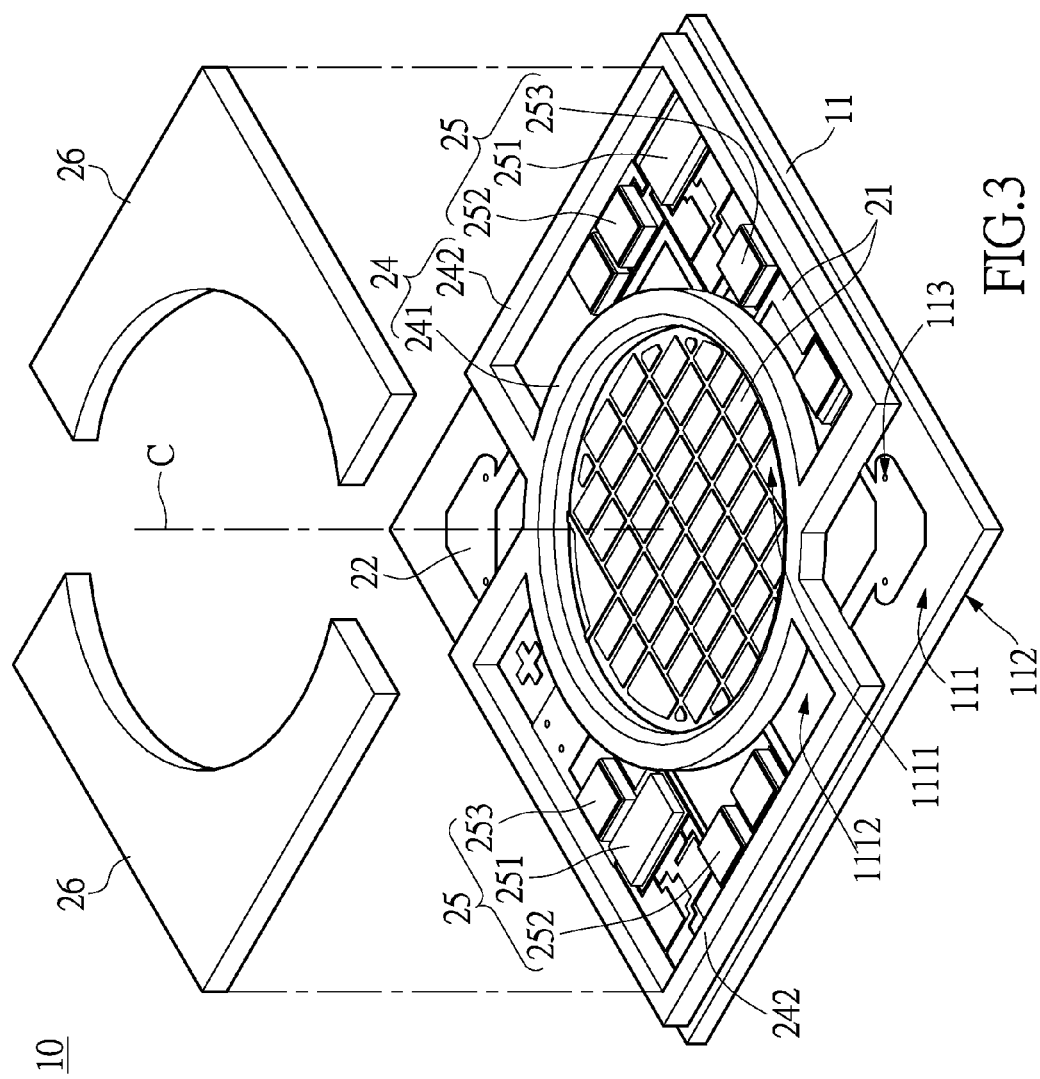
FIG. 3 is a perspective view showing one LED base of the LED base module as shown in FIG. 1.
Figure 4:
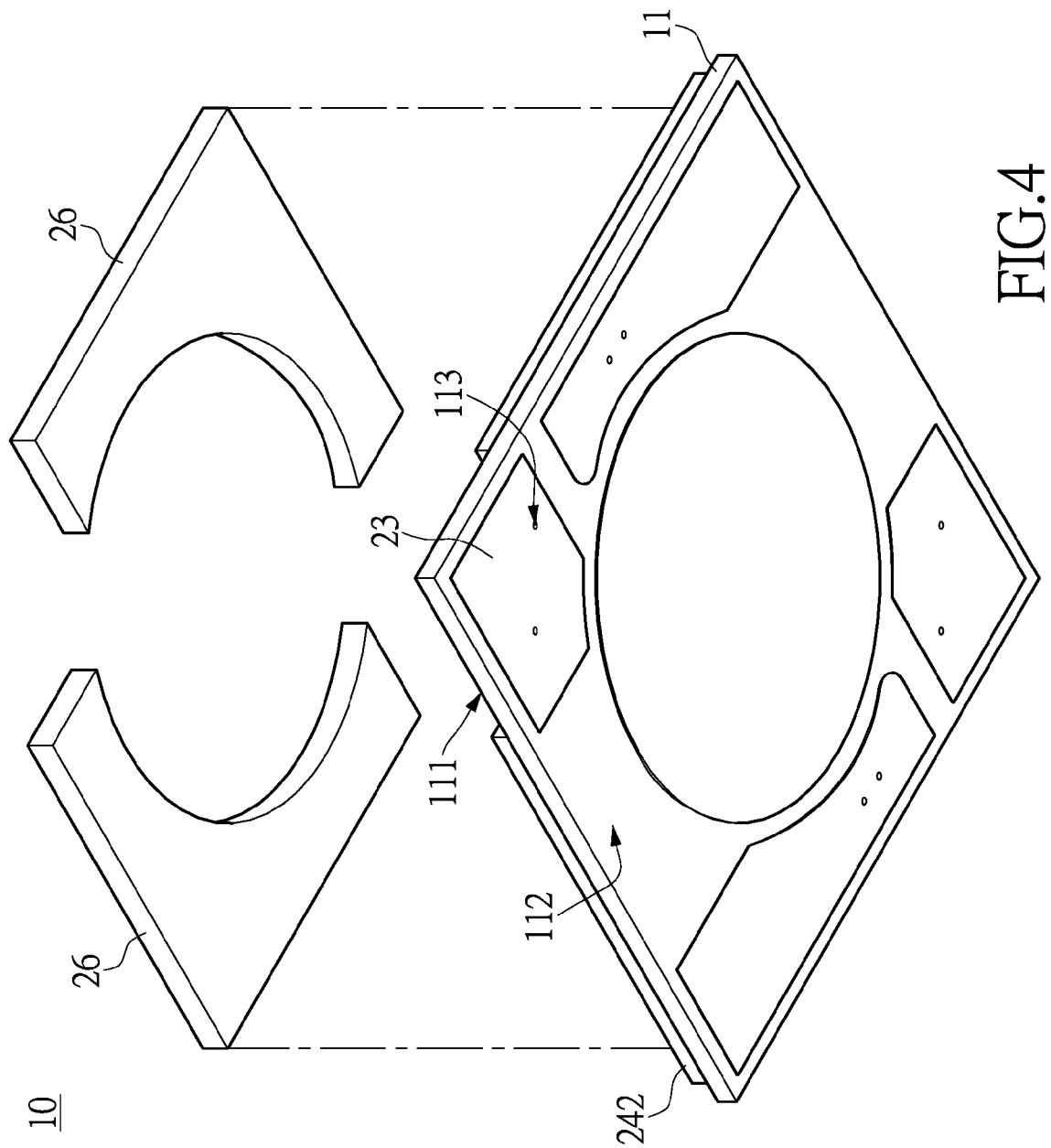
FIG. 4 is a perspective view showing the LED base from another viewing angle.

Please refer to FIGS. 3 and 4, the driving unit 2 has a circuit layer 21, two electrodes 22, two auxiliary electrodes 23, a separating wall 24, a plurality of electronic components 25, and a packaging element 26.

The circuit layer 21 and the electrodes 22 are disposed on the first surface 111 of the carrying portion 11, and the electrodes 22 are electrically connected to the circuit layer 21. In the instant embodiment, the circuit layer 21 and the electrodes 22 are integrally formed as one body on the first surface 111 of the carrying portion 11. The circuit layer 21 and the electrodes 22 are exposed on the carrying portion 11. Moreover, the electrodes 22 are arranged on two opposite corners of the first surface 111 of the carrying portion 11 (e.g., the upper corner and the lower corner of the first surface 111 of the carrying portion 11 as shown in FIG. 3).

Figure 5:
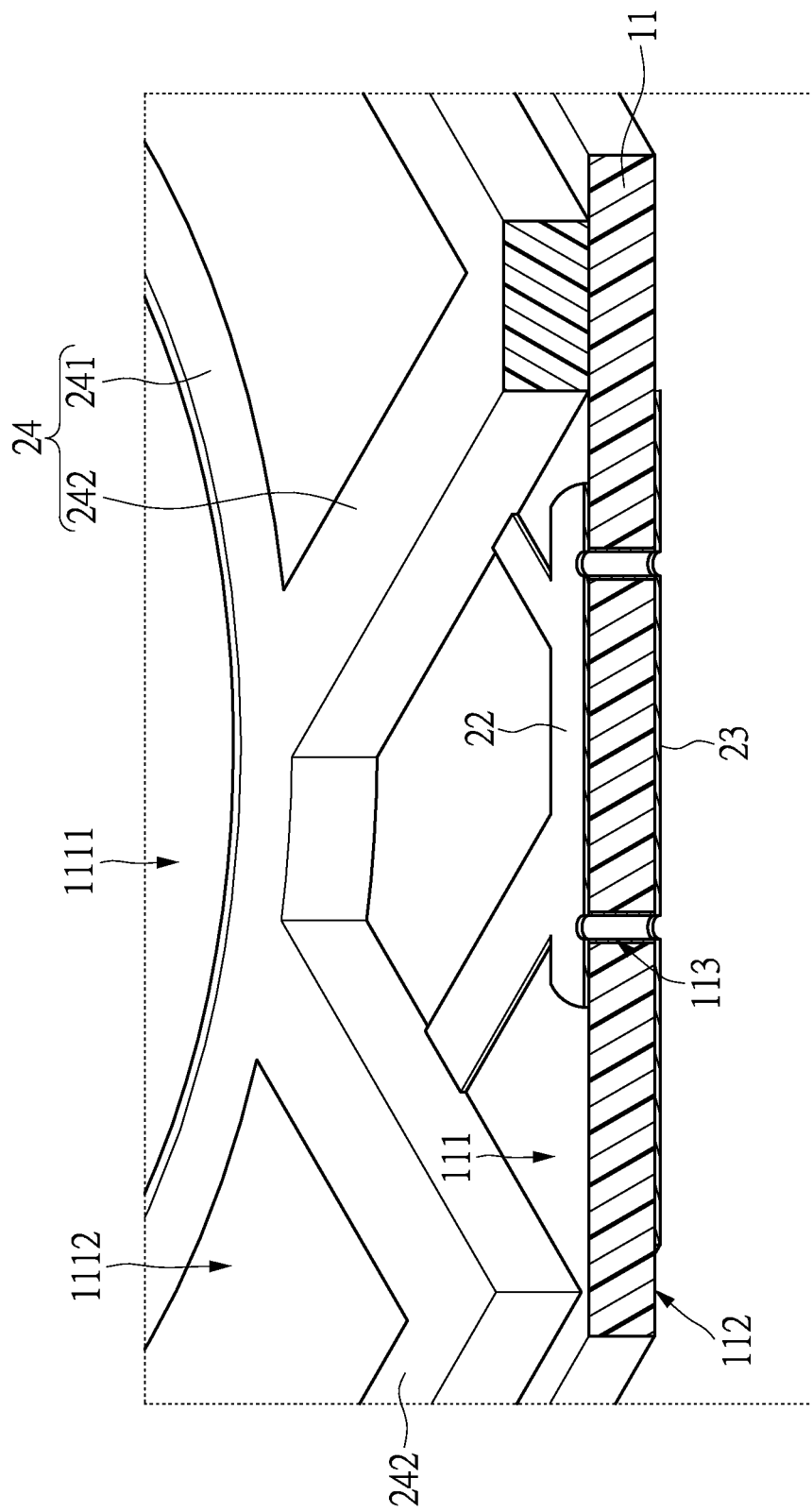
FIG. 5 is a cross-sectional view of FIG. 3.

The auxiliary electrodes 23 are formed on the second surface 112 of the carrying portion 11, and the auxiliary electrodes 23 are respectively electrically connected to the electrodes 22. In the instant embodiment, the auxiliary electrodes 23 are respectively arranged under the electrodes 22, and the electrical connection between each electrode 22 and the corresponding auxiliary electrode 23 is established by a thru hole 113 (as shown in FIG. 5) penetrating the first and second surfaces 111, 112. Specifically, the thru-hole 113 is filled with conductive material (not labeled) to electrically connect the auxiliary electrode 23 and the corresponding electrode 22 via the conductive material.

The material of the separating wall 24 is preferably a ceramic. The separating wall 24 is disposed on the first surface 111 of the carrying portion 11 and arranged on part of the circuit layer 21. The first surface 111 has an LED area 1111 and two electronic component areas 1112, and the LED area 1111 and the electronic component areas 1112 are defined by the separating wall 24. The electrodes 22 are arranged outside the LED area 1111 and the electronic component areas 1112.

Specifically, the separating wall 24 in the instant embodiment has a circular first surrounding wall 241 and two second surrounding walls 242 connected to the first surrounding wall 241. The first surrounding wall 241 is arranged on the center portion of the first surface 111. The second surrounding walls 242 are respectively arranged on two opposite corners of the first surface 111 of the carrying portion 11 (e.g., the left corner and the right corner of the first surface 111 of the carrying portion 11 as shown in FIG. 3). Moreover, the first surrounding wall 241 defines a central axis C penetrating the first surface 111 and passing through the center point of the first surrounding wall 241. The first and second surrounding walls 241, 242 are approximately symmetrical about the central axis C.

The first and second surrounding walls 241, 242 define several enclosed areas. An area of the first surface 111 of the carrying portion 11 surrounded by the first surrounding wall 241 is defined as the LED area 1111, and areas of the first surface 111 of the carrying portion 11 arranged outside the first surrounding wall 241 and respectively surrounded by the first and second surrounding walls 241, 242 are defined as the electronic component areas 1112.

The electronic components 25 in the instant embodiment has two sets of LED driving component 251, rectifying component 252, and power component 253 for example, but the type of the electronic component 25 can be changed according to the designer's request. For example, in a non-shown embodiment, the electronic components 25 can include linear components and non-linear components.

The LED driving components 251, the rectifying components 252, and the power components 253 are mounted on the electronic component areas 1112 and electrically connected to a portion of the circuit layer 12 arranged in the electronic component areas 1112.

The electrical connection between the electronic components 25 and the circuit layer 21 is established by wiring or metal-to-metal connecting (i.e., flip chip, reflow, ultrasonic, surface mounting technology), but is not limited thereto.

Additionally, the two sets of the LED driving components 251, the rectifying components 252, and the power components 253 can be used to respectively drive two kinds of LED chips 200 for emitting two colors of light, thereby adjusting the light proportion of the two kinds of LED chips 200 for achieving a light mixing effect.

The material of the packaging element 26 is preferably a silica gel. The packaging element 26 is formed on the electronic component areas 1112, and the electronic components 25 are embedded in the packaging element 26. Specifically, the electronic component areas 1112 surrounded by the second surrounding walls 242 are fully filled with the packaging element 26, and a surface of the separating wall 24 away from the substrate 1 and an outer surface of the packaging element 26 are approximately coplanar. If the LED driving components 251, the rectifying components 252, and the power components 253 are dies, the packaging element 26 can be integrally formed to package the LED driving components 251, the rectifying components 252, and the power components 253 at the same time, thereby reducing the packaging cost of the LED base module 100.

Moreover, the construction of the separating wall 24 of the instant embodiment enables the packaging element 26 to be formed by dispensing to. However, other than dispensing the packaging element 26 can also be formed by molding wherein a part of the separating wall 24 or the second surrounding walls 242 can be removed.

A portion of the circuit layer 21 of each LED base 10 arranged in the LED area 1111 can be used to bond to a plurality of LED chips 200, thereby establishing electrical connection between the electronic components 25 (e.g., the LED driving components 251, the rectifying components 252, and the power components 253) and the LED chips 200 by the circuit layer 21.

The LED base module 100 of the instant embodiment has the electronic components 25 for driving the LED chips 200. Thus, after bonding the LED chips 200 to each LED base 10, when the electrodes 22 (or the auxiliary electrodes 23) of the LED base 10 are electrically connected to an external power source 500 (e.g., the conventional socket), the electrical power (e.g., AC power) provided by the external power source can be transmitted to the LED chips 200 via the circuit layer 21 and the electrical components 25, thereby causing the LED chips 200 to light.

Incidentally, after bonding the LED chips 200, the LED chips 200 and the electronic components 25 are arranged on the same plane (e.g., the first surface 111 of the carrying portion 11), thus the interference between the LED chips 200 and the electronic components 25 needs to be carefully considered. Accordingly, the LED base 10 is provided with the separating wall 31 to reduce thermal and electromagnetic interferences between the electronic components 25 and the LED chips 200.

Moreover, the two sets of the electronic components 25 are respectively arranged on two opposite outer sides of the first surrounding wall 241, thereby reducing thermal and electromagnetic interferences between the two sets of the electronic components 25 by the arrangement of the electronic components 25 and the separation provided by the separating wall 24.

Additionally, the substrate 1 of the LED base module 100 in the instant embodiment is not a metal plate, because the circuit layer, the electrodes, and the auxiliary electrodes are difficult to be formed on a metal plate, but the material of the substrate 1 is not limited to ceramic.

Figure 8:
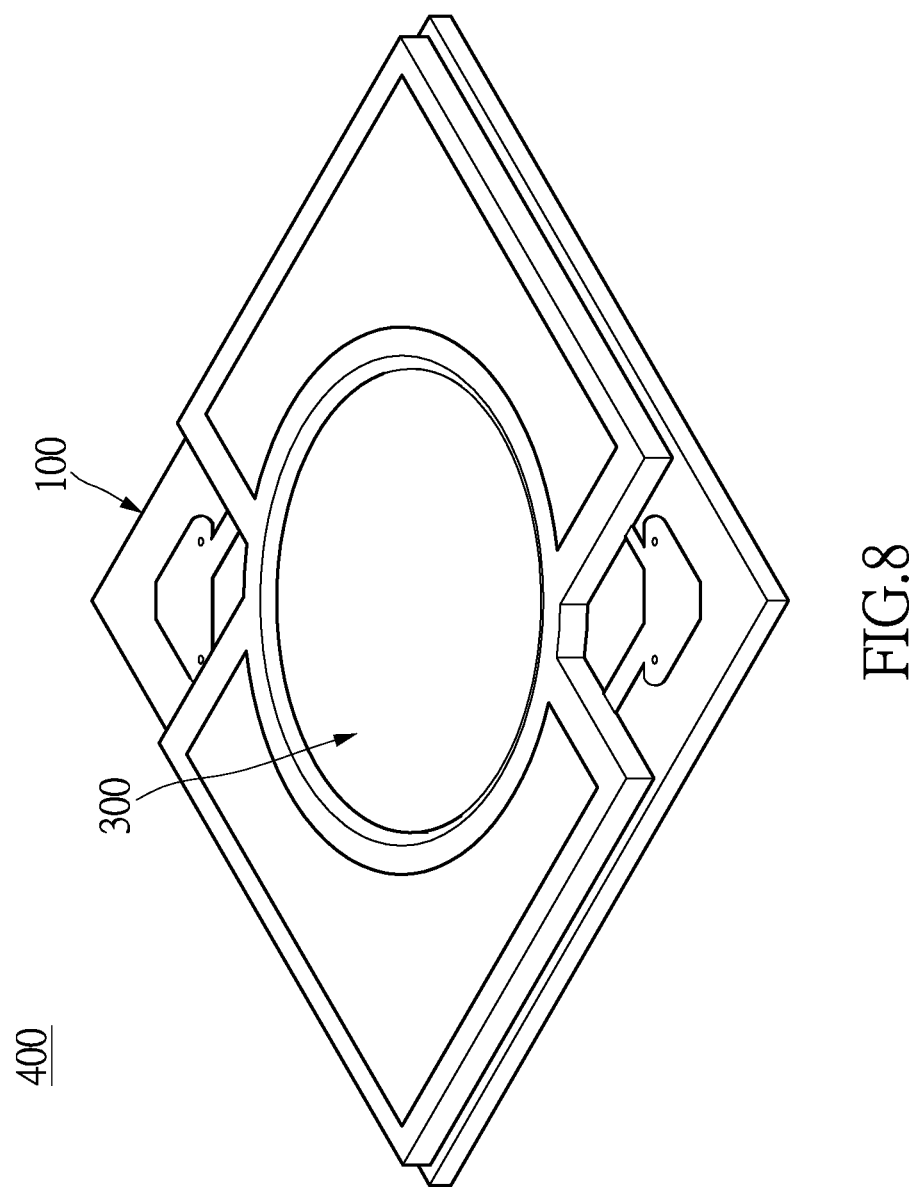
FIG. 8 is a perspective view showing one LED lighting device formed by cutting the construction as shown in FIG. 7.

The above description discloses the construction and the design request of the LED base module 100 provided by the instant embodiment, and the following description discloses how to make the LED base module 100 to form a plurality of LED lighting devices 400 (as shown in FIG. 8).

Please refer to FIG. 6 in reference to FIGS. 1 and 3, which shows bonding a plurality of LED chips 200 to the LED area 1111 of each LED base 10 of the LED base module 100 for establishing electrical connection between the LED chips 200 and the portion of the circuit layer 21 arranged in the LED area 1111.

Specifically, the LED chips 200 mounted on each LED base 10 are respectively two different kinds for emitting two colors of light, and the two sets of the LED driving components 251, the rectifying components 252, and the power components 253 are respectively electrically connected to the two kinds of LED chips 200. Moreover, each LED chip 200 can be a die or a packaged structure, but is not limited thereto.

Figure 7:
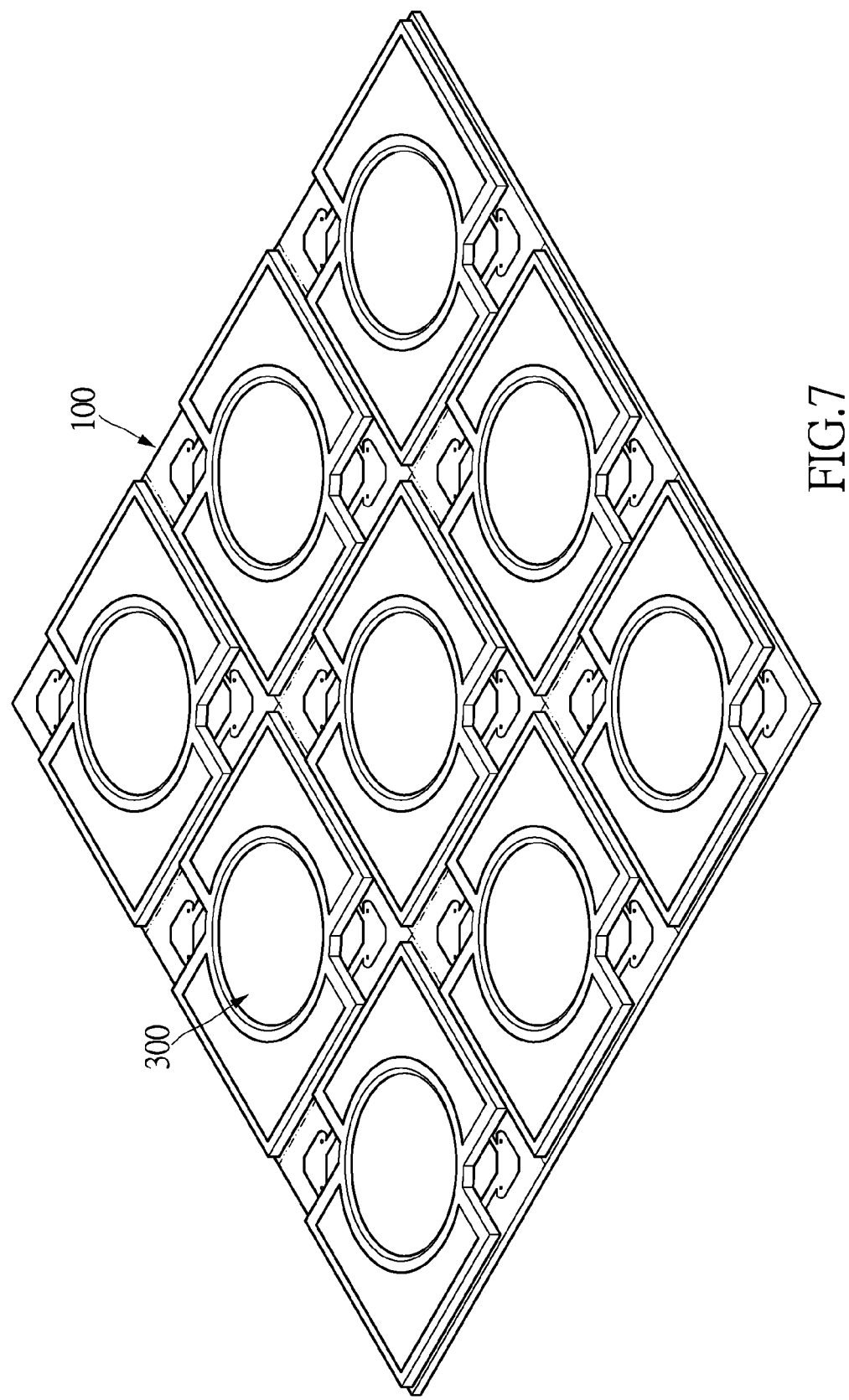
FIG. 7 is a perspective view showing the construction as shown in FIG. 6 filled with a translucent gel.

Please refer to FIG. 7 in reference to FIGS. 1 and 3, which shows filling a translucent gel 300 to the LED area 1111 of each LED base 10 of the LED base module 100, wherein the translucent gel 300 covers the LED chips 200, and then, cutting the construction as shown in FIG. 7 to form a plurality of LED lighting devices 400 (FIG. 8 only shows one of the LED lighting devices 400).

The outer surface of the translucent gel 300 is lower than the outer surface of the packaging element 26. The translucent gel 300 can be transparent, or a plurality of phosphor powders (not labeled) can be embedded in the translucent gel 300 for changing the light emitted from the LED chips 200.

The above description discloses how to make the LED base module 100 to form several LED lighting devices 400, and the following description discloses the possible operation of the LED lighting device 400.

Figure 9:
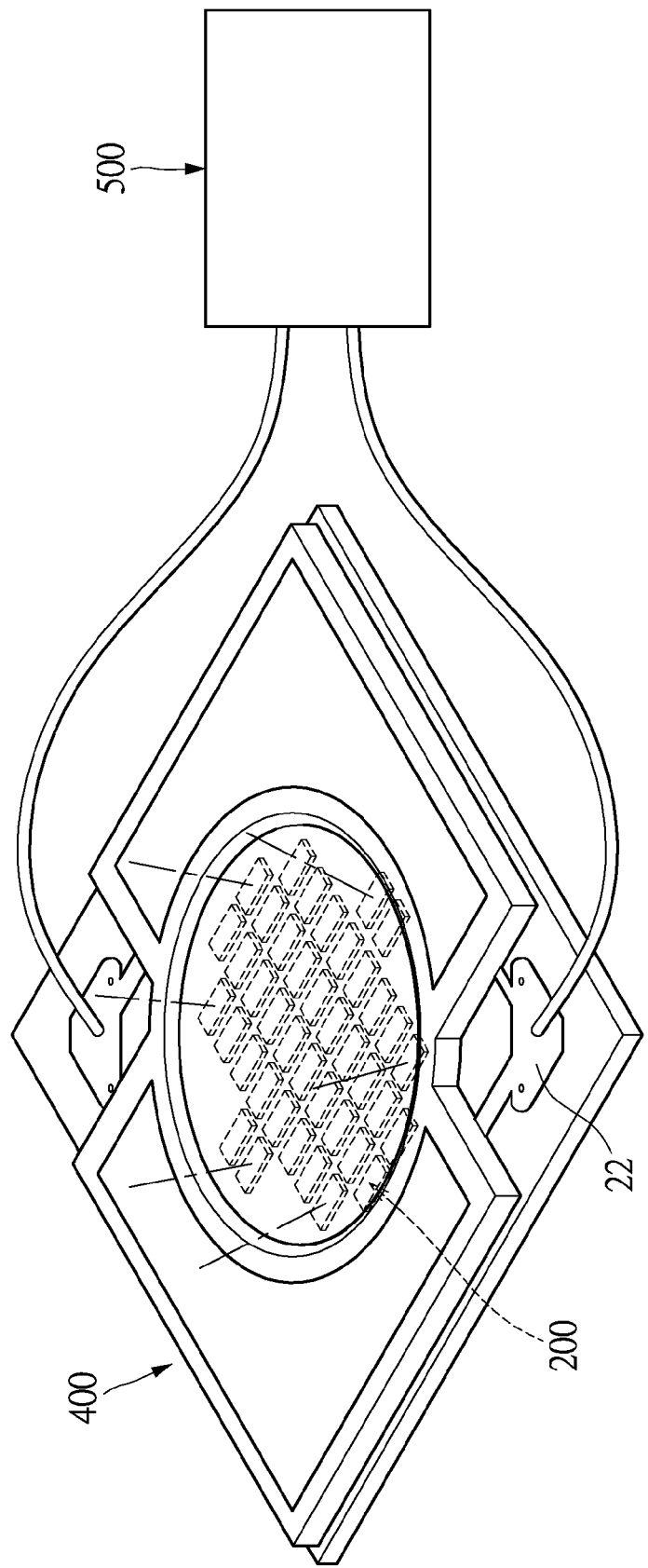
FIG. 9 is a perspective view showing an using state of the LED lighting device.

Please refer to FIG. 9 in reference to FIG. 3. The electrodes 22 of the LED lighting device 400 can be electrically connected to an external power source 500 (e.g., the conventional socket), such that the electrical power (e.g., AC power) provided by the external power source 500 is transmitted to the LED chips 200 via the circuit layer 21 and the electrical components 25, thereby causing the LED chips 200 to light.

Figure 10:
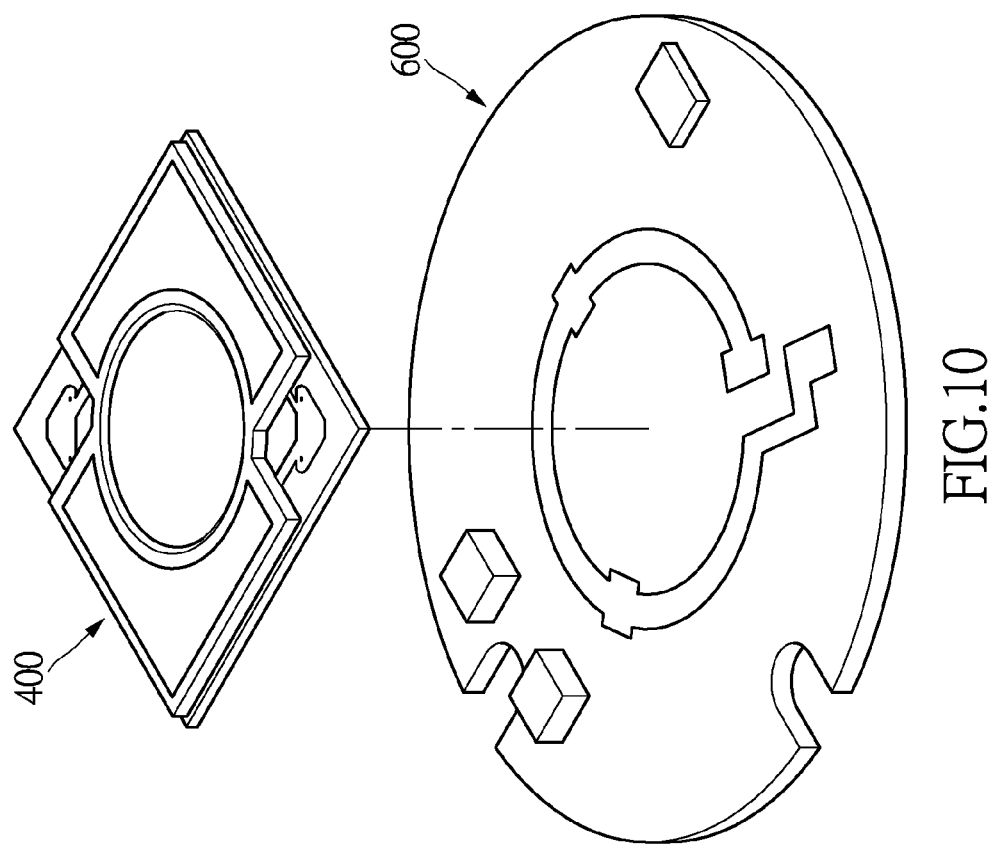
FIG. 10 is a perspective view showing another using state of the LED lighting device.

Moreover, the LED lighting device 400 can be used to electrically connect to another device by the auxiliary electrodes 23 for having a different manner of operation. For example, please refer to FIG. 10 in reference to FIGS. 3 and 4, the LED lighting device 400 can be fixed on a functional board 600 by electrically connecting the auxiliary electrodes 23 and the functional board 600. Specifically, the functional board 600 is provided with a light adjusting function, another function for operating the LED chips 200, and heat dissipating function, thereby operating the LED lighting device 400 according to different demands. Moreover, the LED lighting device 400 and the corresponding device (e.g., the functional board 600) can be connected by welding, screwing, adhering, or other manners, but is not limited thereto.

[The Possible Effect of the Instant Disclosure]

In summary, the LED base module of the instant disclosure is provided with the electronic components for driving each LED chip, such that the LED base module can be directly used to light after bonding an LED chip, thereby reducing the manufacturing threshold of the LED lighting device.

Moreover, the LED base module and the LED lighting device each have the separating wall for reducing thermal and electromagnetic interferences between the LED driving component and the LED chip. The arrangement of the electronic components and the separating wall are configured for reducing thermal and electromagnetic interferences between the two sets of the electronic components.

The descriptions illustrated supra set forth simply the preferred embodiments of the instant invention; however, the characteristics of the instant invention are by no means restricted thereto. All changes, alternations, or modifications conveniently considered by those skilled in the art are deemed to be encompassed within the scope of the instant invention delineated by the following claims.

What is claimed is:

1. An LED base module, comprising:
   a substrate integrally formed as one body and having a plurality of carrying portions thereon, wherein each carrying portion has a first surface and an opposite second surface; and
   a plurality of driving units respectively disposed on the carrying portions of the substrate, wherein each driving unit comprises:
   a circuit layer disposed on the respective carrying portion;
   a separating wall disposed on the first surface of said carrying portion, wherein the first surface has an LED area and at least one electronic component area, and the LED area and the electronic component area are defined by the separating wall;

an LED driving component disposed on the electronic component area, wherein the LED driving component is electrically connected to a portion of the circuit layer arranged in the electronic component area;
a packaging element formed on the electronic component area, wherein the LED driving component is embedded in the packaging element; and
two electrodes disposed on the carrying portion and arranged outside the LED area and the electronic component area, wherein the electrodes are electrically connected to the circuit layer,
wherein a portion of the circuit layer arranged in the LED area is provided for bonding to an LED chip, thereby establishing electrical connection between the LED driving component and the LED chip, and wherein the separating wall is provided for separating the LED driving component from the LED chip, thereby reducing thermal and electromagnetic interferences between the LED driving component and the LED chip.

2. The LED base module as claimed in claim 1, wherein at each driving unit, the circuit layer and the electrodes are formed on the first surface of the carrying portion.

3. The LED base module as claimed in claim 2, wherein at each driving unit, the separating wall has a first surrounding wall and two second surrounding walls connected to the first surrounding wall, an area of the first surface of the carrying portion surrounded by the first surrounding wall is defined as the LED area, an area of the first surface of the carrying portion arranged outside the first surrounding wall and surrounded by the first and second surrounding walls is defined as the electronic component area.

4. The LED base module as claimed in claim 3, wherein at each driving unit, the first surrounding wall defines a central axis perpendicular to the first surface, and the first and second surrounding walls are approximately symmetrical about the central axis.

5. The LED base module as claimed in claim 3, wherein at each driving unit, the carrying portion has a square shape, the second surrounding walls are respectively formed on two opposite corners of the carrying portion, and the electrodes are respectively formed on another two opposite corners of the carrying portion.

6. The LED base module as claimed in claim 2, wherein each driving unit further has two auxiliary electrodes disposed on the second surface of the carrying portion and electrically connected to the electrodes.

7. The LED base module as claimed in claim 1, wherein at each driving unit, a surface of the separating wall away from the substrate and a surface of the packaging element are approximately coplanar.

8. An LED lighting device, comprising:
a carrying portion having a first surface and an opposite second surface;
a circuit layer disposed on the carrying portion;
a separating wall disposed on the first surface of the carrying portion, wherein the first surface has an LED area and at least one electronic component area, and the LED area and the electronic component area are defined by the separating wall;
an LED chip mounted on the LED area and electrically connected to a portion of the circuit layer arranged in the LED area;
a translucent gel formed on the LED area, wherein the LED chip is embedded in the translucent gel;
an LED driving component disposed on the electronic component area, wherein the LED driving component is electrically connected to a portion of the circuit layer arranged in the electronic component area for electrically connecting to the LED chip by the circuit layer;
a packaging element formed on the electronic component area, wherein the LED driving component is embedded in the packaging element; and
two electrodes disposed on the carrying portion and arranged outside the LED area and the electronic component area, wherein the electrodes are electrically connected to the circuit layer,
wherein the separating wall separates the LED driving component from the LED chip for reducing thermal and electromagnetic interferences between the LED driving component and the LED chip.

9. The LED lighting device as claimed in claim 8, wherein the circuit layer and the electrodes are formed on the first surface of the carrying portion, the separating wall has a first surrounding wall and two second surrounding walls connected to the first surrounding wall, an area of the first surface of the carrying portion surrounded by the first surrounding wall is defined as the LED area, an area of the first surface of the carrying portion arranged outside the first surrounding wall and surrounded by the first and second surrounding walls is defined as the electronic component area.

10. The LED lighting device as claimed in claim 9, wherein the carrying portion has a square shape, the second surrounding walls are respectively formed on two opposite corners of the carrying portion, and the electrodes are respectively formed on another two opposite corners of the carrying portion.

* * * * *